(12) United States Patent
Lee

(10) Patent No.: US 6,277,705 B1
(45) Date of Patent: Aug. 21, 2001

(54) METHOD FOR FABRICATING AN AIR-GAP WITH A HARD MASK

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/483,451

(22) Filed: Jan. 14, 2000

(30) Foreign Application Priority Data

Dec. 20, 1999 (TW) ............................................... 088122417

(51) Int. Cl.[7] ...................................................... H01L 21/76
(52) U.S. Cl. ............................. 438/421; 438/422; 438/619
(58) Field of Search ..................................... 438/421, 422, 438/619

(56) References Cited

U.S. PATENT DOCUMENTS

| | | | |
|---|---|---|---|
| 5,310,700 | * | 5/1994 | Lien et al. ............................. 438/618 |
| 5,324,683 | * | 6/1994 | Fitch et al. ............................ 438/422 |
| 5,413,962 | * | 5/1995 | Lur et al. .............................. 438/619 |
| 5,444,015 | * | 8/1995 | Aitken et al. .......................... 438/619 |
| 5,461,003 | * | 10/1995 | Havemann et al. .................. 438/619 |
| 5,559,055 | * | 9/1996 | Chang et al. .......................... 438/586 |
| 6,054,377 | * | 4/2000 | Filipiak et al. ....................... 438/619 |
| 6,090,698 | * | 7/2000 | Lee ........................................ 438/619 |
| 6,130,151 | * | 10/2000 | Lin et al. ............................... 438/619 |
| 6,159,845 | * | 12/2000 | Yew et al. .............................. 438/619 |

* cited by examiner

Primary Examiner—Jey Tsai
Assistant Examiner—Lynne A. Gurley
(74) Attorney, Agent, or Firm—Charles C. H. Wu; Charles C. H. Wu & Associates

(57) ABSTRACT

A fabrication method for an air-gap, in which method hard mask is used, is described. A patterned hard mask layer is formed on a semiconductor substrate. Taking advantage of the etching selectivity of the hard mask layer to the dielectric layer, an opening with a high aspect ratio is formed in the dielectric layer. A conductive plug is then formed in the opening, followed by forming a conductive layer on the hard mask layer to cover the conductive plug. The hard mask layer is further removed. A silicon oxide layer with poor step coverage is formed to cover the substrate. Using the space remaining after the removal of the hard mask layer, an air-gap is formed between the conductive layer and the dielectric layer to enhance the insulation effect.

20 Claims, 3 Drawing Sheets

METHOD FOR FABRICATING AN AIR-GAP WITH A HARD MASK

CROSS-REFERENCE TO RELATED APPLICATION

This application claims the priority benefit of Taiwan application serial no. 88122417, filed Dec. 20, 1999.

BACKGROUND OF THE INVENTION

1. Field of the Invention

The present invention relates to a method for fabricating a semiconductor device. More particularly, the present invention relates to a method for fabricating an air gap between the interconnects using a hard mask.

2. Description of the Related Art

Advances in the semiconductor technology continuously decrease the semiconductor device dimension into the deep sub-micron territory. As the density of an integrated circuitry increases, the wafer surface becomes insufficient for the manufacturing of the necessary numbers of interconnects. To accommodate the increased number of interconnects, the multi-level metal conductive connect design becomes the approach for Very Large Scale Integration technology.

The continuous decrease in the distance between the metal conductive layers, however, is accompanied by an increase in the aspect ratio of the dielectric layer between the metal conductive layers. The coupling capacitance between the metal conductive layers is thereby increased, leading to the formation of a parasitic capacitance. Parasitic capacitance in a microelectronic device contributes to undesirable effects such as an increase of the RC delay time when electronic signals are being transmitted between the metal linings. As a result, the speed of the electronic signal transmission between the metal linings is retarded and the operational speed of the semiconductor device is limited.

In order to reduce the transistor-capacitance delay time of the signal transmission, the development of a material with a low dielectric constant k has become the major trend in the semiconductor industry. Currently, materials with a low dielectric constant that are being developed mainly include the spin on polymer (SOP) and the organic spin on glass (OSOG), in which the dielectric constant is approximately between 2 and 4. As the manufacturing of semiconductors enters the deep sub-micron territory, the dielectric layer requires an even lower dielectric constant to accommodate the diminishment of the device dimensions and to improve the performance of the device. Air, having a dielectric constant of close to one and being inexpensive, has become one of the dielectric materials currently under development. If air can be used as a dielectric material, the insulation effect can be highly increased.

SUMMARY OF THE INVENTION

Based on the foregoing, the present invention provides a fabrication method for forming an air-gap using a hard mask. The hard mask layer is used to increase the etching selectivity on the dielectric layer to form an opening with a high aspect ratio. The space occupied by the hard mask layer is further used to form an air-gap after the removal of the hard mask layer.

The present invention provides a fabrication method for forming an air-gap using a hard mask, which method is applicable on a semiconductor substrate. The semiconductor substrate comprises a first conductive layer, for example, a source/drain region of a metal oxide semiconductor (MOS) or a metal interconnect, wherein a dielectric layer is formed on the first conductive layer. The fabrication method according to the present invention includes forming a patterned hard mask layer on the dielectric layer. A portion of the dielectric layer is removed to form an opening in the dielectric layer and to expose the first conductive layer while using the patterned hard mask layer as a mask. A conductive material then fills the opening, forming a conductive plug in the dielectric layer to electrically connect with the first conductive layer. After this, a second conductive layer is formed on the hard mask layer, covering the conductive plug and electrically connecting to the conductive plug. The hard mask layer is then removed, followed by forming a poor step coverage silicon oxide layer, for example, a plasma enhanced silicon oxide layer, to cover the substrate. An air-gap is further formed between the second conductive layer and the dielectric layer to reduce the parasitic capacitance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
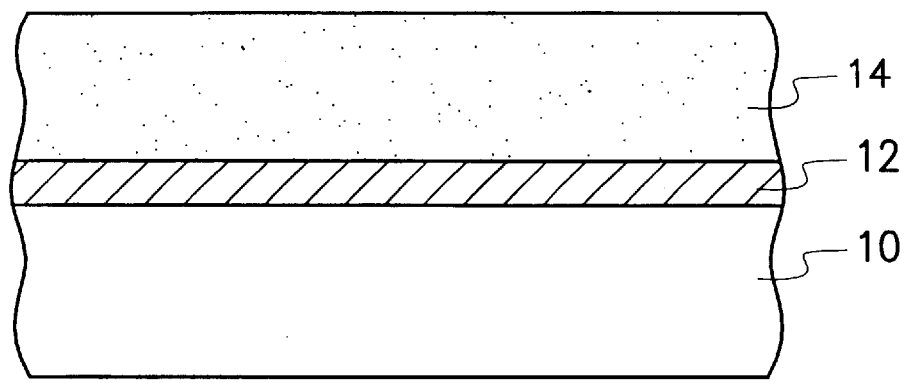
FIGS. 1A to 1F are schematic, cross-sectional views showing the manufacturing of an air-gap according to the present invention.

Referring to FIG. 1A, a semiconductor substrate 10 is provided. The semiconductor substrate 10, already having undergone many semiconductor processes, has many semiconductor devices, such as a metal oxide semiconductor (MOS), formed thereon. The semiconductor device substrate 10 comprises a conductive layer 12. The conductive layer 12 is, for example, a source/drain region of a MOS device or a metal interconnect layer. Using the metal interconnect layer as an example, the conductive layer 12 is covered with a dielectric layer 14, for example, a silicon oxide layer, or a sandwich layer comprising a silicon oxide layer, low dielectric constant material layer and a silicon oxide layer.

Figure 1B:
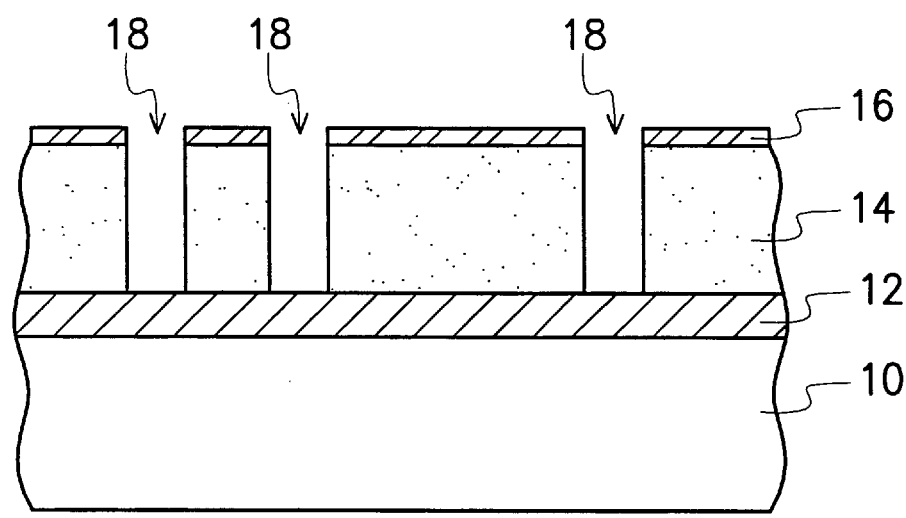

Referring to FIG. 1B, a patterned hard mask layer 16 is formed on the dielectric layer 14, which is, for example, a silicon nitride layer. The patterned hard mask layer 16 is formed by, for example, forming a silicon nitride layer to cover the dielectric layer 14, followed by forming a photoresist layer on the silicon nitride layer. The traditional photolithography techniques are employed to pattern the photoresist layer to form the required pattern. The silicon nitride layer is then etched using the patterned photoresist layer as a mask, forming the required hard mask. The photoresist layer is subsequently removed.

Thereafter, using the patterned hard mask layer 16 as a mask, anisotropic etching is conducted to form an opening 18 in the dielectric layer, for example, a contact opening or a via opening, exposing the conductive layer 12. As known to those who are skilled in the pertinent art, since a hard mask layer 16 is formed on the dielectric layer 14, the etching selectivity is increased. The aspect ratio of the opening 18 is thus increased.

Figure 1C:
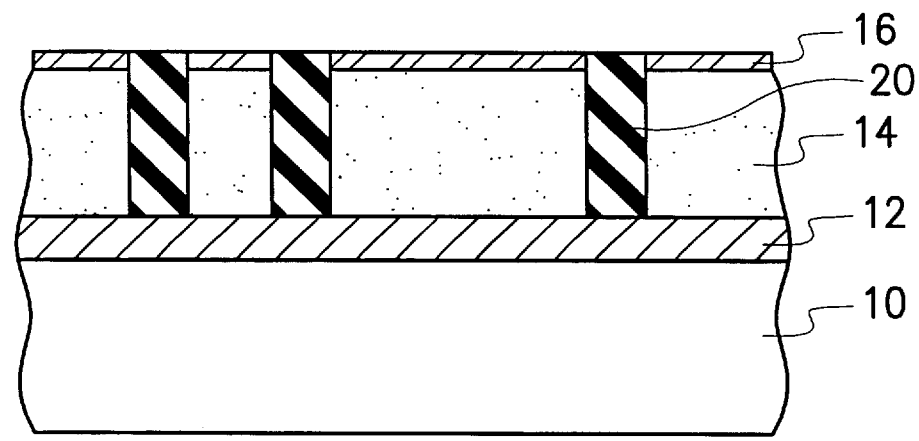

Continuing to FIG. 1C, a conductive material, for example, tungsten (W), titanium (Ti), aluminum (Al) or doped polysilicon, then fills the opening 18 to form a conductive plug 20, which is electrically connected to the conductive layer 12. Before the formation of the conductive plug 20, a thin, conformal adhesive layer, for example, titanium nitride (TiN) or titanium tungsten (TiW) (not shown in Figure) can be selectively formed on the sidewall of the opening 18. The conductive plug 20 is formed subsequently. The conductive plug 20 is formed by, for example, forming a layer of tungsten on the hard mask layer 16 and filling the opening 18, followed by etching back or chemical mechanical polishing to remove the excessive tungsten on the hard mask layer 16. The remaining tungsten in the opening 18 thus forms the conductive plug 20. Additionally, a selective tungsten deposition can be used to form the conductive plug 20.

Figure 1D:
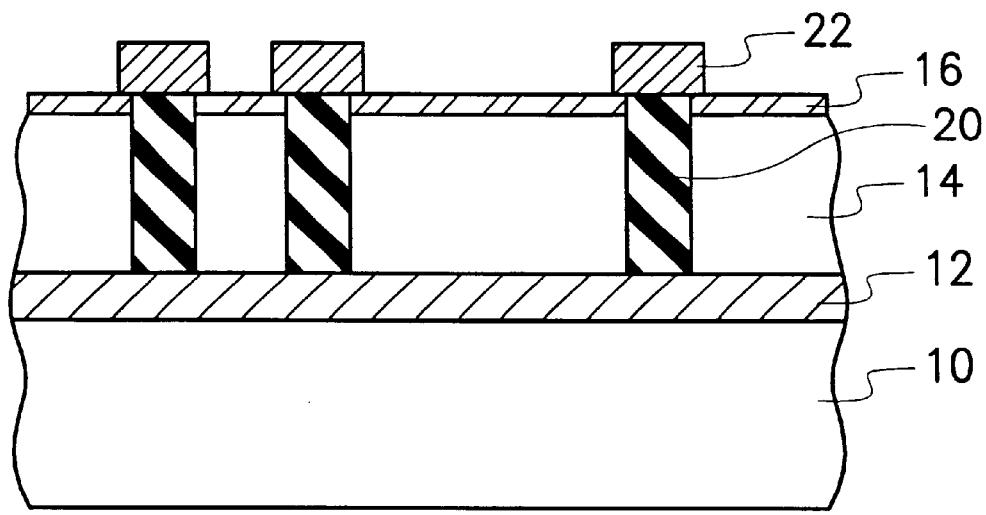

As shown in FIG. 1D, a patterned conductive layer 22 is formed on the hard mask layer 16, covering the conductive plug 20 and electrically connecting to the conductive plug 20, wherein a portion of the hard mask layer 16 is exposed. The patterned conductive layer 22, such as a metal interconnect, is formed from, for example, aluminum or copper. Using the metal interconnect as an example, its formation includes forming an aluminum layer on the hard mask layer 16, followed by employing the traditional photolithography and etching techniques to pattern the aluminum layer to form a conductive layer 22.

Figure 1E:
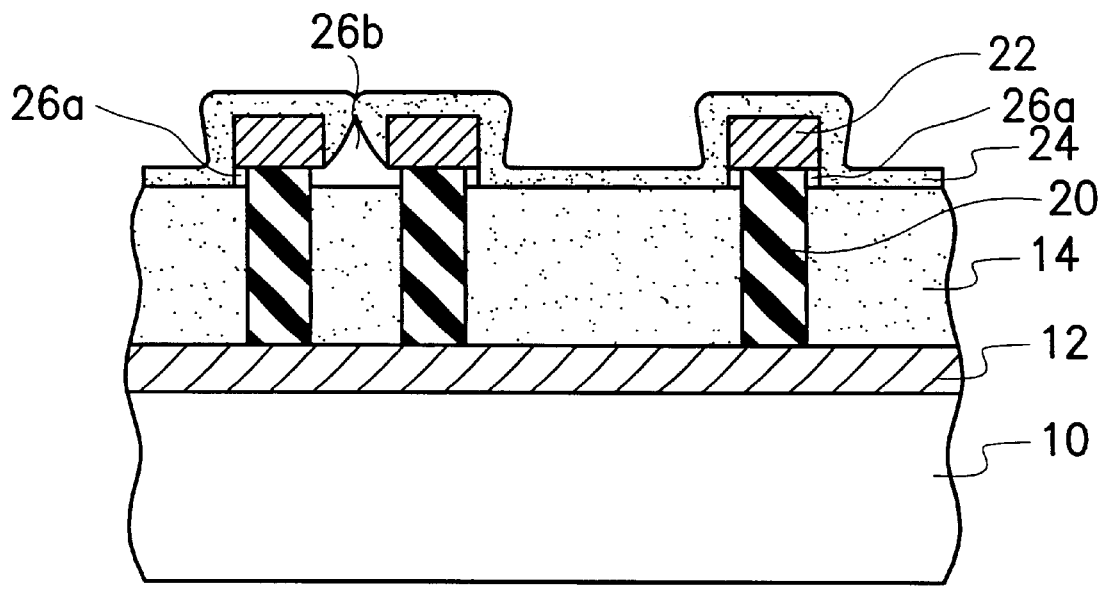

Referring to FIG. 1E, the hard mask layer 16 is then removed. If, for example, a silicon nitride hard mask layer 16 is used, isotropic etching with phosphoric acid ($H_3PO_4$) can completely remove the hard mask layer 16. A silicon oxide layer with a poor step coverage, for example, a plasma enhanced silicon oxide layer formed by plasma enhanced chemical vapor deposition, is formed covering the substrate 10. Using the poor step coverage characteristic of the silicon oxide layer, the conductive layer 22 and the dielectric layer 14 are directly covered with the silicon oxide layer and an air gap 26a is formed between the conductive layer 22 and the dielectric layer 14 (which is the space previously occupied by the mask layer 16). When the distance between two metal conductive lines is very close, the RC time delay issue is especially significant. Since an even bigger air gap 26b is formed between two closely located conductive lines due to the poor step coverage characteristic of the silicon oxide layer of the present invention and because the dielectric constant of air is about 1, the capacitance is thus significantly increased to enhance the insulation. The insulation between the two neighboring metal conductive lines is thereby increased to prevent the RC time delay.

Figure 1F:
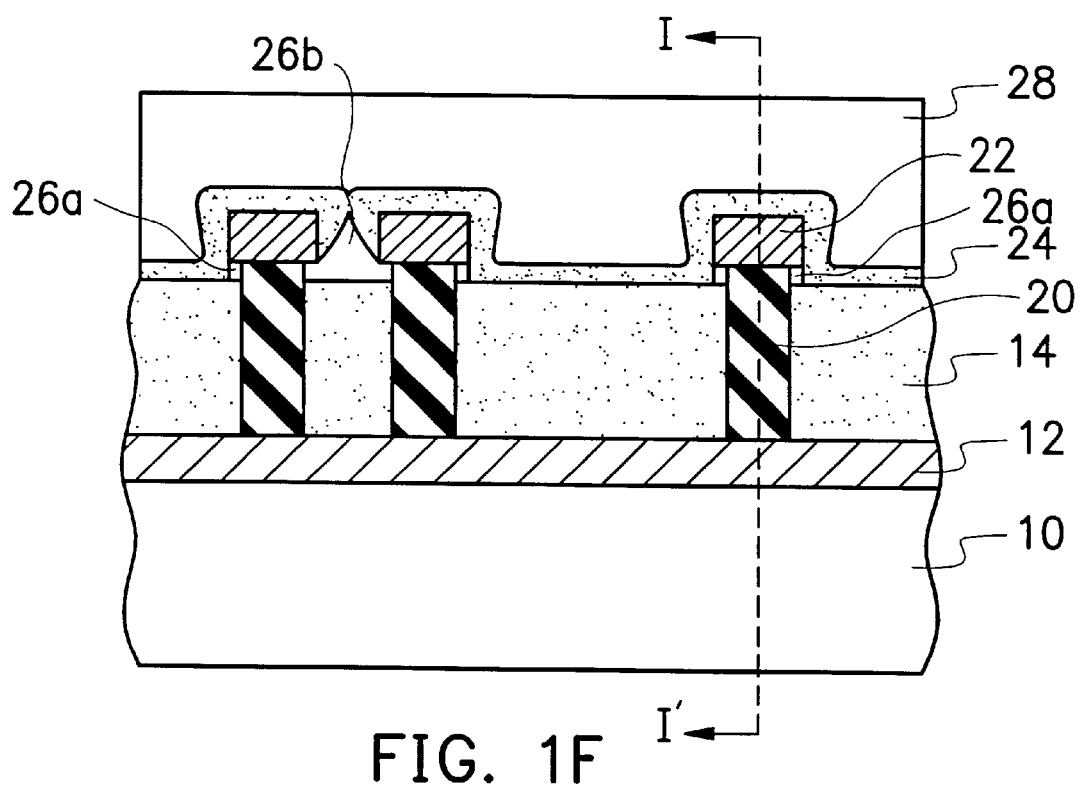

Continuing to FIG. 1F, a low dielectric constant material layer 28 is formed on the silicon oxide layer 24 with the poor step coverage characteristic. The low dielectric constant material layer 28 includes spin-on-glass formed by spin coating, such as hydrogen silsesquioxane (HSQ), or spin-on-polymer such as PAE or FLARE. A planarizing process is further conducted, for example, by chemical mechanical polishing.

Figure 2:
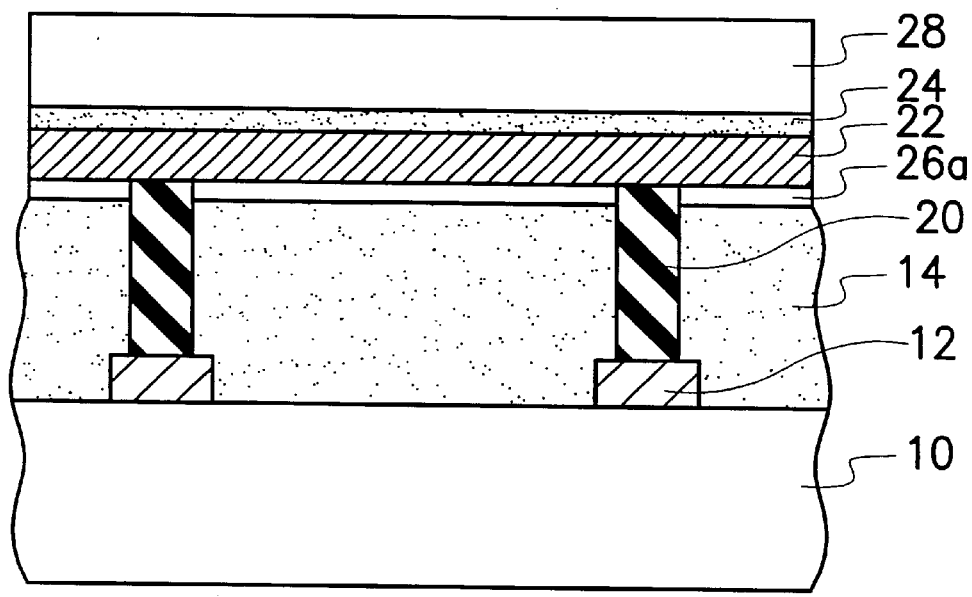
FIG. 2 is a schematic, cross-sectional view along the line I–I' of FIG. 1F.

To further explain the location of the air-gap, reference is made to FIG. 2, which is a cross-sectional view along the line I–I' in FIG. 1F. As shown in FIG. 2, the conductive layer 12 is perpendicular to the conductive layer 22, and these tow layers are connected to each other through the conductive plug 20. From FIG. 2, it is clear that the air-gap 26a is formed between the conductive layer 22 and the dielectric layer 14.

According to the preferred embodiment of the present invention, forming the hard mask layer in the present invention increases the etching selectivity, thereby forming an opening with a higher aspect ratio. The space results after the removal of the hard mask layer forms the air-gap 26a, which can effectively increase the capacitance and thus lower the resistance-capacitance delay effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for forming an air-gap, which method uses a hard mask and is applicable on a semiconductor substrate, wherein the semiconductor substrate comprises a first conductive layer and a dielectric layer is formed on the first conductive layer, the method comprising the steps of:

forming a patterned hard mask layer on the dielectric layer;

removing a portion of the dielectric layer to form an opening in the dielectric layer and to expose the first conductive layer, while using the patterned hard mask layer as a mask;

filling the opening with a conductive material to form a conductive plug in the dielectric layer and to electrically connect to the first conductive layer;

forming a patterned second conductive layer on the hard mask layer to cover the conductive plug and to electrically connect to the conductive plug, wherein a portion of the hard mask layer is exposed;

removing the hard mask layer; and covering the substrate with a silicon oxide layer having a poor step coverage to form an air-gap between the second conductive layer and the dielectric layer.

2. The method according to claim 1, wherein the formation of a hard mask layer includes using a silicon nitride layer.

3. The method according to claim 1, wherein the step of removing a portion of the dielectric layer includes anisotropic etching.

4. The method according to claim 1, wherein the conductive material includes tungsten.

5. The method according to claim 1, wherein the second conductive layer includes aluminum.

6. The method according to claim 1, wherein the second conductive layer includes copper.

7. The method according to claim 1, wherein removing the hard mask layer includes isotropic wet etching.

8. The method according to claim 1, wherein the silicon oxide layer having the poor step coverage is formed by plasma enhanced chemical vapor deposition.

9. The method according to claim 1, wherein a layer of a low dielectric constant material is further formed on the silicon oxide layer having the poor step coverage.

10. A method for forming an air-gap, which is applicable on a semiconductor substrate, wherein the semiconductor substrate comprises a first metal layer and a dielectric layer is formed on the first metal layer, the method comprising:

forming a patterned hard mask layer on the dielectric layer;

removing a portion of the dielectric layer to form a via opening in a dielectric layer and to expose a first metal layer, using the patterned hard mask layer as a mask;

filling the via opening with a conductive material to form a conductive plug in the dielectric layer and to electrically connect to the first metal layer;

forming a patterned second metal layer on the hard mask layer to cover the conductive plug and to electrically connect to the conductive plug, wherein a portion of the hard mask layer is exposed;

removing the hard mask layer; and covering the substrate with a silicon oxide layer to form an air-gap between the metal layer and the dielectric layer.

11. The method according to claim 10, wherein the mask layer includes a silicon nitride layer.

12. The method according to claim 10, wherein a portion of the dielectric layer is formed by anisotropic etching.

13. The method according to claim 10, wherein the conductive material includes tungsten.

14. The method according to claim 10, wherein before the step of filling the via opening with the conductive material further includes forming a conformal adhesive layer on a sidewall of the via opening.

15. The method according to claim 10, wherein the second metal layer includes aluminum.

16. The method according to claim 10, wherein the second metal layer includes copper.

17. The method according to claim 10, wherein the hard mask layer is removed by isotropic wet etching.

18. The method according to claim 10, wherein the silicon oxide layer is formed by plasma enhanced chemical vapor deposition.

19. The method according to claim 10, wherein a low dielectric constant material is further formed on the plasma enhanced silicon oxide layer.

20. The method according to claim 10, wherein the low dielectric constant material includes hydrogen silsesquioxane.

* * * * *